United States Patent [19]

King

[11] Patent Number: 5,635,622
[45] Date of Patent: Jun. 3, 1997

[54] METHOD OF COMPENSATING FOR GAUGE HYSTERESIS

[75] Inventor: Douglas J. King, Flint, Mich.

[73] Assignee: Delco Electronics Corporation, Kokomo, Ind.

[21] Appl. No.: 549,498

[22] Filed: Oct. 27, 1995

[51] Int. Cl.$^6$ ................................................. G01D 7/00
[52] U.S. Cl. ..................... 73/1.01 ; 73/866.3; 73/866.1; 73/1.73; 73/1.75
[58] Field of Search ..................... 73/866.1, 866.3, 73/2, 1 R, 1 H, 1 B

[56] References Cited

U.S. PATENT DOCUMENTS

| | | | |
|---|---|---|---|
| 3,709,310 | 1/1973 | Cooke et al. | 177/168 |
| 5,359,284 | 10/1994 | Hawes et al. | 324/146 |

Primary Examiner—Hezron E. Williams
Assistant Examiner—Nashmiya Ashraf
Attorney, Agent, or Firm—Jimmy L. Funke

[57] ABSTRACT

Gauge inaccuracy due to hysteresis or lag during movement in one direction in response to a drive signal is overcome by predicting the amount of lag, which is a function of the desired amount of movement as measured from the farthest point attained during movement in the opposite direction, and adding the predicted lag to the drive signal.

5 Claims, 2 Drawing Sheets

METHOD OF COMPENSATING FOR GAUGE HYSTERESIS

FIELD OF THE INVENTION

This invention relates to the operation of instrument gauges and particularly to a method of improving gauge accuracy by predicting and compensating for hysteresis.

BACKGROUND OF THE INVENTION

Analog instruments in motor vehicles for indicating speed or fuel level, for example, generally use a gauge comprising an electrically driven armature which moves a pointer across a dial. An electrical signal proportional to the parameter measured ideally drives the pointer to an angular position representing the parameter. Hysteresis in the gauge causes a lag in the gauge movement so that actual pointer position falls short of the ideal position. As the signal changes in a manner to change direction of the pointer, the pointer reverses at a turn-around point to move in the new direction.

An arrangement for correcting for hysteresis uses a dual table approach; a table for each direction of motion alters the gauge motion. The problem with that approach is that the gauge jumps at turn-around points because the two tables are too far apart, or there is insufficient correction away from turn-around points because the tables are too close together. Another arrangement adds a fixed increment of movement in the current direction. The problem here is that it causes jumps at turn-around points because the increment is too large, or there is insufficient correction away from turn-around points because the increments are too small.

It is therefore desirable to correct gauge movement in a manner which eliminates gauge jumps at the turn-around points and improves accuracy at regions far from the turn-around points.

SUMMARY OF THE INVENTION

It is therefore an object of the invention to compensate for hysteresis throughout the gauge range. Another object in such compensation is to avoid gauge jumps upon change of direction of the gauge.

Improved compensation is based on the observation that the gauge lag due to hysteresis depends on the angle of gauge movement since the last turn-around, so that small corrections are required for small angles of movement and larger corrections are required for large angles.

The gauge system includes an analog signal input to a microcontroller which sends a control signal to a gauge driver which produces sine and cosine drive signals to drive the gauge. The microcontroller is programmed to recognize the turn-around points and calculate the angle size between the turn-around point and the current angle demanded by the signal. An equation embodied in the microcontroller then uses the angle size for expressing the expected lag angle. The lag angle is then added to the current angle to obtain the compensated control signal. This is sufficient to position the gauge to a much improved accuracy in all ranges and without jumps.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

The ensuing description is directed to a gauge compensation scheme developed specifically for automotive gauges such as fuel level gauge, speedometer, and the like. It will be recognized, however, that the invention is not limited to such automotive uses but can be applied where improved gauge accuracy is desired.

Figure 1:
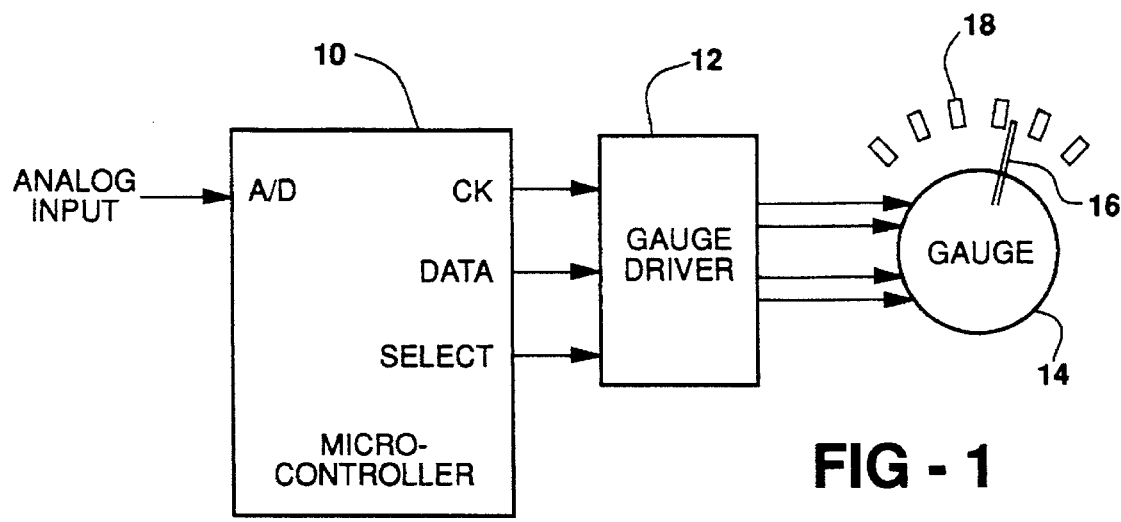
FIG. 1 is a block diagram of a gauge and its drive system for carrying out the invention.

Referring to FIG. 1, an analog input from a speed sensor or a fuel level sensor, for example, is connected to the A/D input of a microcontroller 10 which has a serial clock output, a data output and a chip select output. The outputs are carried by separate buses to a gauge driver 12 which in turn has two pairs of outputs coupled to a gauge 14. The gauge has a pointer 16 which sweeps across a dial 18 to indicate fuel level or vehicle speed.

The microcontroller 10 develops a digital output which represents the magnitude of the input signal plus a compensation for gauge hysteresis lag. A program for determining the compensation is embodied in the microcontroller and is discussed below. The gauge driver 12 converts the digital signal to sine and cosine waveforms to drive the gauge pointer through an angle to the desired position. If desired, the gauge driver function could be incorporated into the microcontroller.

Figure 2:
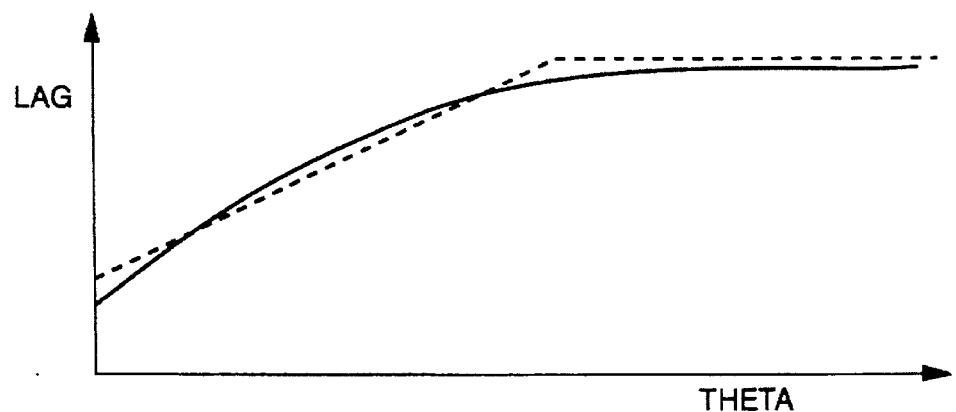
FIG. 2 is a graph of gauge lag as a function of angle of movement.

In the absence of hysteresis compensation the gauge movement in response to the input signal tends to lag so that it falls short of the ideal position. The amount of lag is a function of the commanded movement from the turn-around point which is the last gauge position attained during movement in the opposite direction. The difference between the current angle and the turn-around angle is herein called "Theta". FIG. 2 illustrates by a solid line a typical gauge lag as a function of Theta. The curve has some slope at low angles and approaches a zero slope at large angles. It is approximated by a linear function with a maximum value, shown in dashed lines, comprising a sloped line at small angles and a horizontal line at large angles.

Figure 3:
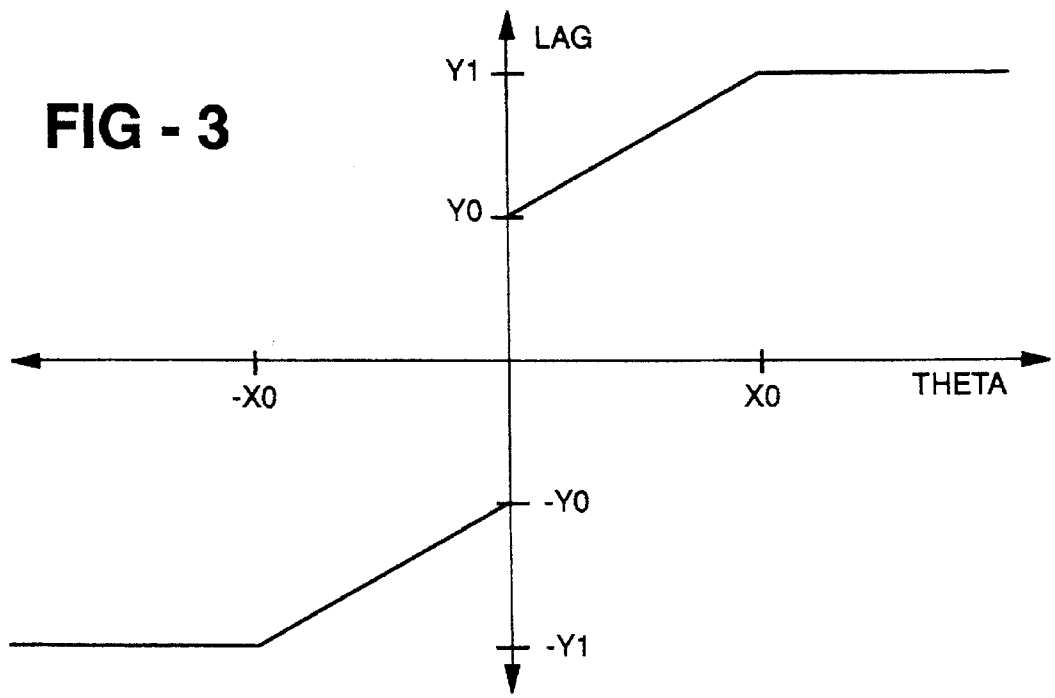
FIG. 3 is a graph of lag values used for gauge compensation according to the invention.

FIG. 3 shows the linear lag approximation which has a positive value for clockwise gauge movement and a negative value for counter-clockwise movement. As Theta increases from zero to a value X0, the lag increases from a value Y0 the Y1. For angles greater than X0 the lag remains constant at Y1. The value of these parameters varies greatly from one type of gauge to another and must be empirically determined. For example the value of X0 my be in the range of 2° to about 10°, while Y0 may be about 0.2° and Y1 may be about 1° to 1.5°. The calibrated parameters for a particular gauge type are programmed into the microcontroller for calculation of the lag for any given value of Theta. Only the positive values of the parameters need be used for the calculation and the result is changed in sign when the movement is counter-clockwise.

Figure 4:
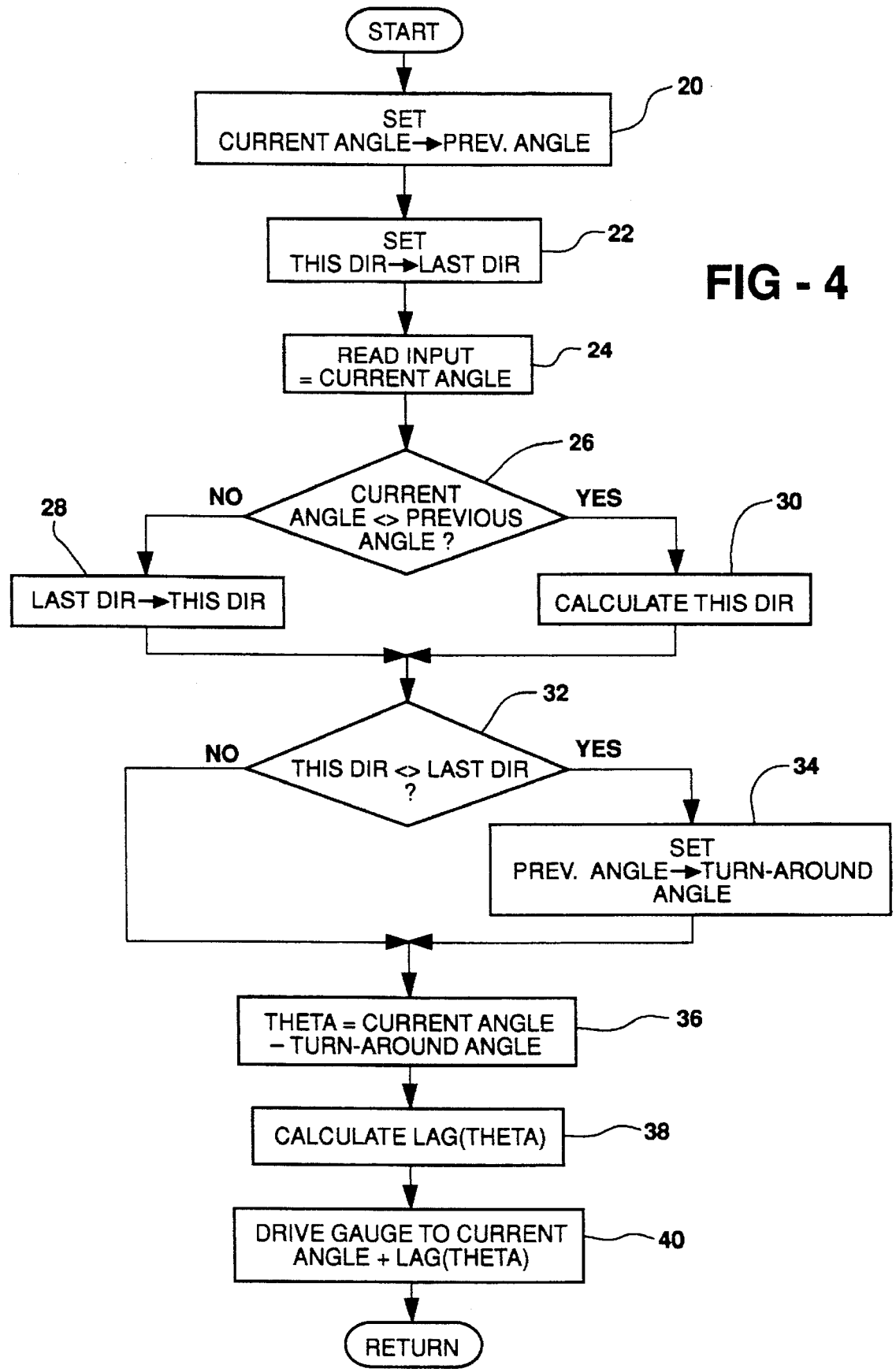
FIG. 4 is a flow chart representing a program for carrying out the method of the invention.

A flow chart representing the microcontroller program for lag compensation is shown in FIG. 4 wherein the functional description of each block in the chart is accompanied by a number in angle brackets <nn> which corresponds to the reference number of the block. The program is repeated every 7.8 msec, for example. In a typical iteration the Current Angle read in the previous iteration is stored as the Previous Angle <20>, and the direction identified as "This Direction" in the previous iteration is stored as the "Last Direction" <22>. The digitized value of the analog input signal present at the current iteration is read and stored as the "Current Angle" <24>. Next the Current Angle and the Previous Angle are compared to determine direction <26>. If the angles are equal, the last direction is adopted as this direction <28> and if the angles are not equal the value of This Direction is determined on the basis of which angle is larger <30>. It is desirable to require that in step 26 that the angles differ by a minimum amount to determine non-equality to assure that a direction change is detected only upon a significant change in signal.

To detect direction change This Direction is compared to Last Direction <32> and if they are different the previous angle is stored as the Turn-around Angle <34>. Otherwise the previously stored value of Turn-around Angle is maintained. Then Theta is calculated by the difference of the Current Angle and the Turn-around Angle <36> and the lag is calculated as a function of Theta <38> as discussed relative to FIG. 3. Finally the lag is summed with the Current Angle to achieve the compensated signal and the gauge is driven by that compensated signal <40>.

Thus it will be seen that a correct gauge position is attained in a simple manner by predicting the lag value for each desired gauge movement and adding the lag value to the drive signal for hysteresis compensation, the lag value being positive or negative depending on the direction of movement. It should be recognized that although the preferred embodiment of the invention uses a linear approximation of the lag function, a non-linear function may be used instead.

The embodiments of the invention in which an exclusive property or privilege is claimed are defined as follows:

1. A method of overcoming hysteresis in a gauge having a pointer movable in clockwise and counter-clockwise directions to a position defining gauge angle and defining a turn-around angle at each change in direction, the gauge operated by a microcontroller wherein an input signal to the microcontroller commands a current gauge angle and the microcontroller repetitively determines a drive angle signal sufficient to compensate for a lag due to hysteresis, the method comprising the steps of:

determining current angle from the input signal;

determining current direction of pointer movement;

determining the turn-around angle which is the farthest angle attained in the most recent previous direction;

calculating the difference between the current angle and the turn-around angle;

determining the lag as a function of the calculated difference;

deriving the drive angle signal by summing the current angle and the lag; and applying the derived drive angle signal to the gauge.

2. The method as defined in claim 1 wherein the drive angle signal is determined in a series of iterations and the step of determining the direction of pointer movement comprises:

for each iteration of determining the drive angle signal, storing the current angle and current direction of the most recent past iteration as the previous angle and the previous direction;

comparing the previous angle and the current angle;

when the current angle is substantially the same as the previous angle, adopting the previous direction as the current direction; and when the current angle substantially differs from the previous angle, determining the current direction from relative sizes of the previous and current angles.

3. The method as defined in claim 2 wherein the step of determining the turn-around angle comprises:

detecting a change of direction of the pointer; and when a change of direction occurs, storing the previous angle as the turn-around angle.

4. The method as defined in claim 1 wherein the drive angle signal is determined in a series of iterations and the step of determining the turn-around angle comprises for each iteration of determining the drive signal storing the previous direction of the pointer;

detecting a change of direction; and when a change of direction occurs, storing the previous angle as the turn-around angle.

5. The method as defined in claim 1 wherein determining the lag as a function of the calculated difference comprises:

storing an equation expressing the lag as a function of the difference between the current angle and the turn-around angle; and solving the equation for the calculated difference.

* * * * *